United States Patent [19]

Stewart et al.

[11] Patent Number: 5,440,448
[45] Date of Patent: Aug. 8, 1995

[54] ELECTRONIC SYSTEM WITH COMPACT CARD EJECTOR

[75] Inventors: Gregory N. Stewart; Christian G. Okonsky, both of Austin, Tex.

[73] Assignee: Dell USA, L.P., Austin, Tex.

[21] Appl. No.: 248,831

[22] Filed: May 25, 1994

Related U.S. Application Data

[63] Continuation of Ser. No. 903,074, Jun. 22, 1992, abandoned.

[51] Int. Cl.6 .......................... G06F 1/16; H01R 13/62; H05K 7/10
[52] U.S. Cl. ..................... 361/684; 439/159; 361/754; 361/753
[58] Field of Search ........... 360/99.02; 439/152, 439/159, 160, 76, 157; 364/708.1; 235/479, 485, 486; 361/679, 683–687, 725–727, 731, 737, 754, 798, 753

[56] References Cited

U.S. PATENT DOCUMENTS

| | | | |
|---|---|---|---|
| 3,695,741 | 10/1972 | Dollenmayer | 360/99.02 X |
| 4,894,792 | 1/1990 | Mitchell et al. | 364/708 |
| 5,032,857 | 7/1991 | Miki et al. | 354/288 |
| 5,161,989 | 11/1992 | Okabo et al. | 439/159 |

FOREIGN PATENT DOCUMENTS

91/00681  1/1991  WIPO ................. 361/684

OTHER PUBLICATIONS

Palmer, "Tiny PC Cards Pack A Punch", *Datamation*, (Apr. 1992), pp. 55–57.

*Primary Examiner*—Michael W. Phillips
*Attorney, Agent, or Firm*—James Huffman

[57] ABSTRACT

A small computer having a card interface slot in a side of the computer. An inserted electronic card, the connector on its inserted end mates firmly with a connector at the inner end of the recess behind the slot. The user ejects an inserted card by sliding a slider which is positioned in a shallow recess on the bottom of the computer, near the slot. The slider is connected to an ejector which actually presses against the inner end of the card. By moving the slider with his thumb, the user can push the card out far enough to disengage the contacts of the card, and then can readily remove the card by hand or allow it to drop out.

4 Claims, 13 Drawing Sheets

ELECTRONIC SYSTEM WITH COMPACT CARD EJECTOR

This application is a continuation of application Ser. No. 07/903,074, filed Jun. 22, 1992, now abandoned.

PARTIAL WAIVER OF COPYRIGHT PURSUANT TO 1077 O.G. 22 (Mar. 20, 1987)

All of the material in this patent application is subject to copyright protection under the copyright laws of the United States and of other countries. As of the first effective filing date of the present application, this material is protected as unpublished material.

However, permission to copy this material is hereby granted to the extent that the owner of the copyright has no objection to the facsimile reproduction by anyone of the patent document or patent disclosure, as it appears in the United States Patent and Trademark Office patent file or records, but otherwise reserves all rights whatsoever.

CROSS-REFERENCE TO OTHER APPLICATIONS

The following applications of common assignee contain at least some drawings in common with the present application, and are believed to have effective filing dates identical with that of the present application, and are all hereby incorporated by reference:

Ser. No. 07/902,329, filed Jun. 22, 1992, entitled Small Computer System With Power-Robbing External Disk Drive" (DC-255); and Ser. No. 07/901,645, filed Jun. 22, 1992, entitled "Computer With IC Card BIOS Override Circuit" (DC-256).

BACKGROUND AND SUMMARY OF THE INVENTION

The present invention relates to computer systems (and particularly to small computer systems), and to methods for using them:

Laptop and Smaller Computers

Portable personal computers were introduced in the early 1980s, and proved to be very useful and popular. As this market has developed, it has become increasingly clear that users strongly desire systems to have small volume, small weight, physical durability, and long battery-powered lifetime. Thus, small portable computers ("laptop" computers) have proven extremely popular during the late 1980s. Users continue to demand more features, longer time between recharges, and lower weight and volume. This combination of demands is difficult to meet. Moreover, in about 1990, another smaller generation of portable computers, referred to as "notebook" computers, began to appear; and even smaller computers are now appearing. These smaller form factors have only exacerbated the difficulty of the above tradeoffs.

To meet the weight, volume, and power budgets of small portable computers, much effort has been made to re-engineer familiar components, within the limits of acceptable compromise with user comfort and convenience, to attain the needed portability. For example, almost no laptop or notebook computers have had more than two disk drives (typically one floppy drive and one hard drive); the keyboards are much smaller than would be optimal for touch typists; and the displays are much smaller than on common desktop models.

Ergonomics of Very Small Computers

As efforts are made to make computers smaller and more portable, all elements of the physical design must be reconsidered. In particular, the ergonomics of the computer in use must be very carefully weighed. A machine which will frequently be in use for hours on end must have very comfortable input and output interfaces.

If touch-typing compatibility is required, this will set a minimum size constraint. For computers adapted for typing as a primary input, the standard keyboard layout sets a minimum area which cannot easily be varied. Moreover, touch typists demand at least 3 mm of key travel.

However, within the limits of this minimum size constraint (if relevant), there is great demand for reduced size and weight. Thus, the volume of the display is minimized; power-management methods are used to minimize the energy storage requirements (and hence the weight and volume) of the battery; the number of connectors is strenuously reduced; and internal floppy disk drives are eliminated.

One result of these pressures is that there is very little available surface area. To meet the envelope demanded by users, the computer's overall envelope will tend to be flattened as much as possible. Since the keyboard defines the minimum footprint, it will occupy nearly all of the area of one of the maximal surfaces. Since greater display area (in small sizes) provides greatly improved legibility, the display will consume nearly all of the area of another of the maximal surfaces. Since the display and keyboard are both critical components, they will typically be designed to face into the interior when the system is in a closed configuration. Thus, in a two-piece configuration (such as the familiar clamshell), almost no area is available on interior large surfaces.

"IC Cards" and: the PCMCIA Standard

The PCMCIA standard provides a new standard connection for interfacing to a very small computer. Small computers which follow this standard will have a slot into which small electronic cards, containing a variety of functions, can be inserted.

The PCMCIA standard was defined by the Person Computer Memory Card Industry Association, in collaboration with the Japanese Electronic Industry Development Association. See, e.g., Plamer, "Tiny PC cards pack a punch," DATAMATION, v.38 no. 9 (Apr. 15, 1992), at 55ff, which is hereby incorporated by reference. Under the PCMCIA standard, a form factor, connector interface, and (to some extent) an electrical interface have been defined for compact computer cards. For example, the 82365SL chip from Intel is commonly used to provide a standard electrical interface to such cards. (This chip is also known as a "PC IC", or PC card interface controller chip). Note that the PCMCIA card standard is not used only for computers. It can also be used for control interfaces other complex microprocessor-controlled equipment, or has storing audio or video signals. (In fact, this card standard has already been proposed as a data exchange format for electronic cameras.) These cards have a well-defined form factor, which has a width of 54 millimeters, a length of 85.6 millimeters, and a thickness which is either 3 millimeters (for a "Type 1" card, shown in FIG.

2A) or 5 millimeters (for a "Type 2" card, shown in FIG. 2B). In either case, the connector geometry is the same, and the card's width at its edge is only 3 mm. This permits either type of card to be inserted in the same cavity, if the opening of the cavity is wide enough. The possibility of a "type 3" card which would be 10 mm thick, and similarly compatible, has also been discussed.

Cards of many functions are possible for this interface. In addition to battery backed nonvolatile RAMs, these cards may also include, e.g., ROM, EPROM, flash EEPROMS, modem, external drive interface, or a coprocessor card.

The standard card configuration includes 68 sockets at the end of the card. These sockets insert straight into corresponding set of pins at the back of a slot inside the computer. (The pins are guarded by a sidewall which prevents misaligned insertion from causing bent pins. The standard block of pins is normally provided as a header which can be soldered onto a circuit board.)

Because of the tight constraints on the form factor of small computers (such as notebook and palmtop computers), the depth of the slot which accepts the card is normally designed so that the card will not protrude beyond the computer's surface when fully inserted. (Because of the portability of these small computers, the card or its connections would be exposed to damage if the card end protruded outside the envelope of the chassis.) The "envelope" of the chassis, as used herein, refers to the smallest convex solid which could enclose the chassis. Intuitively, the envelope may be thought of as a tight "shrink-wrap" enclosing the chassis. In considering the ergonomics of a small system, the envelope is important for at least two reasons: 1) the portability of the computer, from the user's point of view, is defined by the computer's envelope. 2) Any design change which adds any protrusion outside the envelope of the chassis is likely to degrade durability, since such a protrusion can be impacted directly by contacts with other objects. This means that the user cannot readily grasp an inserted card's end to pull the card out.

In the normal arrangement for computers using such cards, pushbutton is used to eject the card. This pushbutton is normally mounted on the same surface of the computer as the slot. The pushbutton is connected through an intermediate lever to a fork with two fingers which bear on the flat spaces at the rear of the card, to push the card out. These flat spaces were defined in the PCMCIA specification, for card ejection.

Innovative Computer System and Method

The present invention provides a small computer with PC card interface, and an improved ejection mechanism. The PCMCIA standard appears likely to dominate in the 1990s, but is not the only proposed standard. For example, Intel has proposed an "ExCA" (Exchangeable Card Architecture) standard, which uses a different electrical interface, but essentially the same physical interface. Therefore, the disclosed innovations can also be applied to systems using ExCA cards (or another similar interface card definition) instead of, or in addition to, PCMCIA cards. In accordance with the PCMCIA standard, ejection is accomplished by pressure on the defined flat spaces at the back of the card. However, according to the present invention, the ejection mechanism is accommodated without any disruption of the envelope of the computer. Instead, a sliding button (hereinafter "slider") is emplaced in a shallow recess in the surface of the computer. This slider is connected to a metal fork which bears on the defined spaces at the rear of the card. This provides a simpler and cheaper mechanism, avoids disruption of the external form factor of the computer, and is also less vulnerable to breakage than the competing approaches.

This approach also saves additional volume on the interior of the computer. The conventional pushbutton ejection mechanism uses a bellcrank to translate the pushbutton's inward motion into outward motion of the ejector fork. With the system of the present invention, no such motion-translation mechanism is needed, which saves space and increases reliability.

The force required to initially move the card, when it is fully seated on the contacts, is high. (This force is typically at least several pounds of force, and may be more for new contacts.) However, the force required decreases rapidly as the contacts separate, since the engaged length of the contacts is small (well under a centimeter). The presently preferred embodiment provides a slider with short travel, but permits the user to apply enough force at the slider to move the card.

One of the innovative teachings set forth herein is that the slider, for ejecting the card, is on a bottom surface of the computer—specifically, in the presently preferred embodiment, on the underside of the keyboard. This placement is possible, without disruption of the ergonomics, because the slider is recessed into its surface.

Part of the attraction of the PCMCIA card standard is that it is compatible with a flattened envelope: the height requirement of the slot and connector is less than a centimeter. Part of the advantage of the disclosed innovations is that they preserve this compatibility with a flattened envelope.

BRIEF DESCRIPTION OF THE DRAWING

The present invention will be described with reference to the accompanying drawings, which are schematic for clarity and which are incorporated in the specification thereof by reference, wherein.

DESCRIPTION OF THE PREFERRED EMBODIMENTS

Figure 1A:
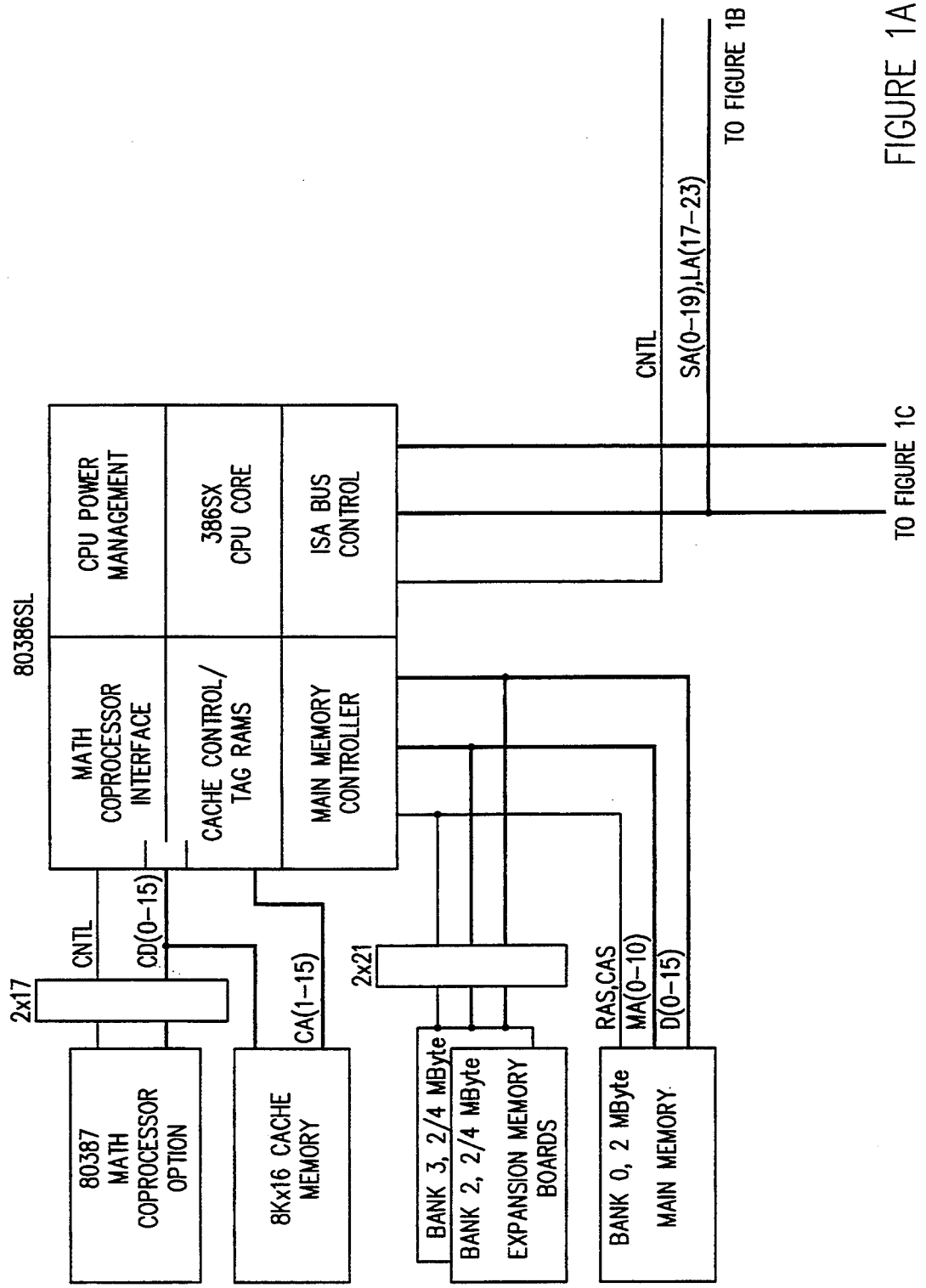
FIGS. 1A, 1B, 1C, 1D and 1E are parts of a single block diagram of the electrical organization of the small computer system of the presently preferred embodiment.
Figure 1B:
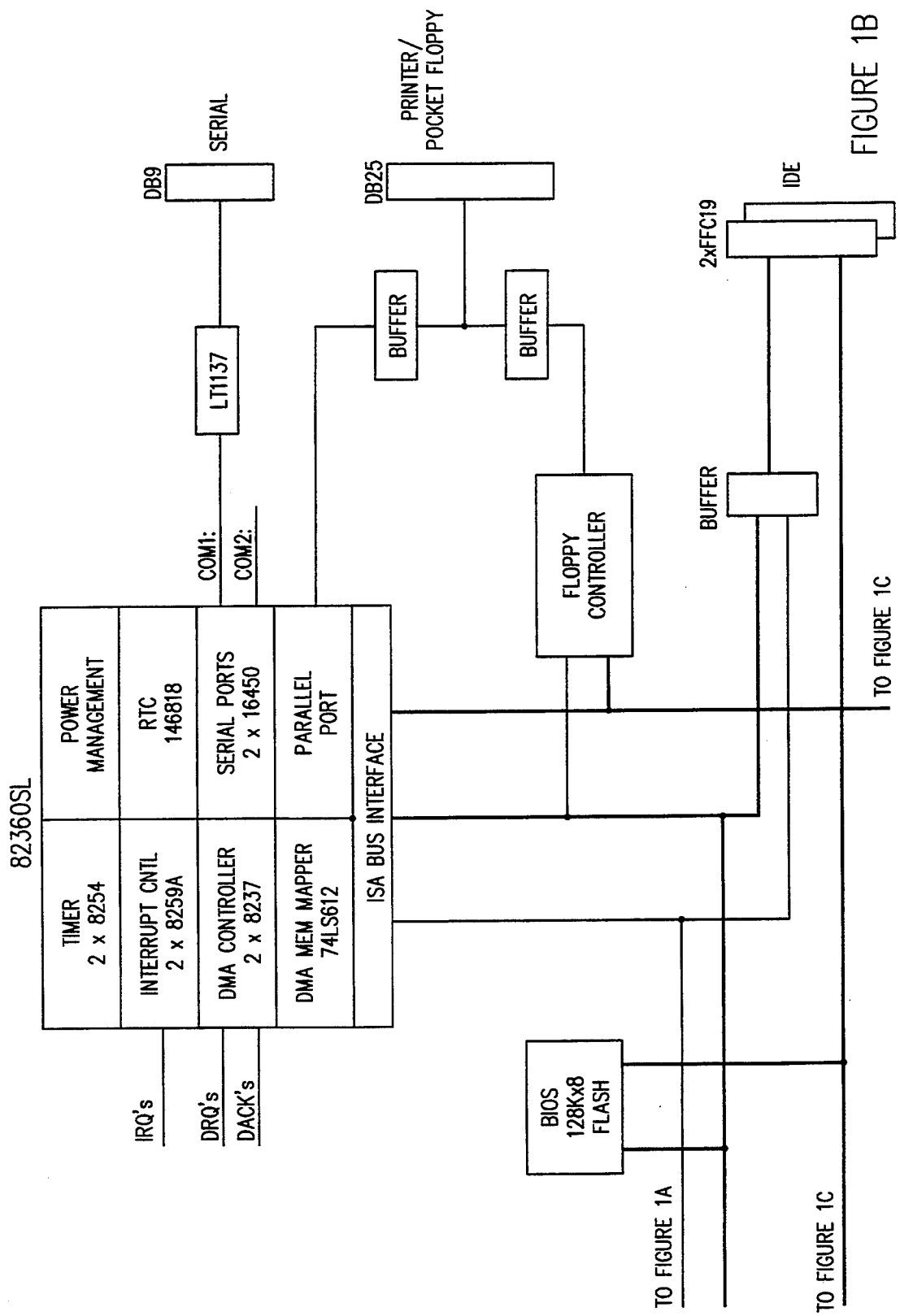
Figure 1C:
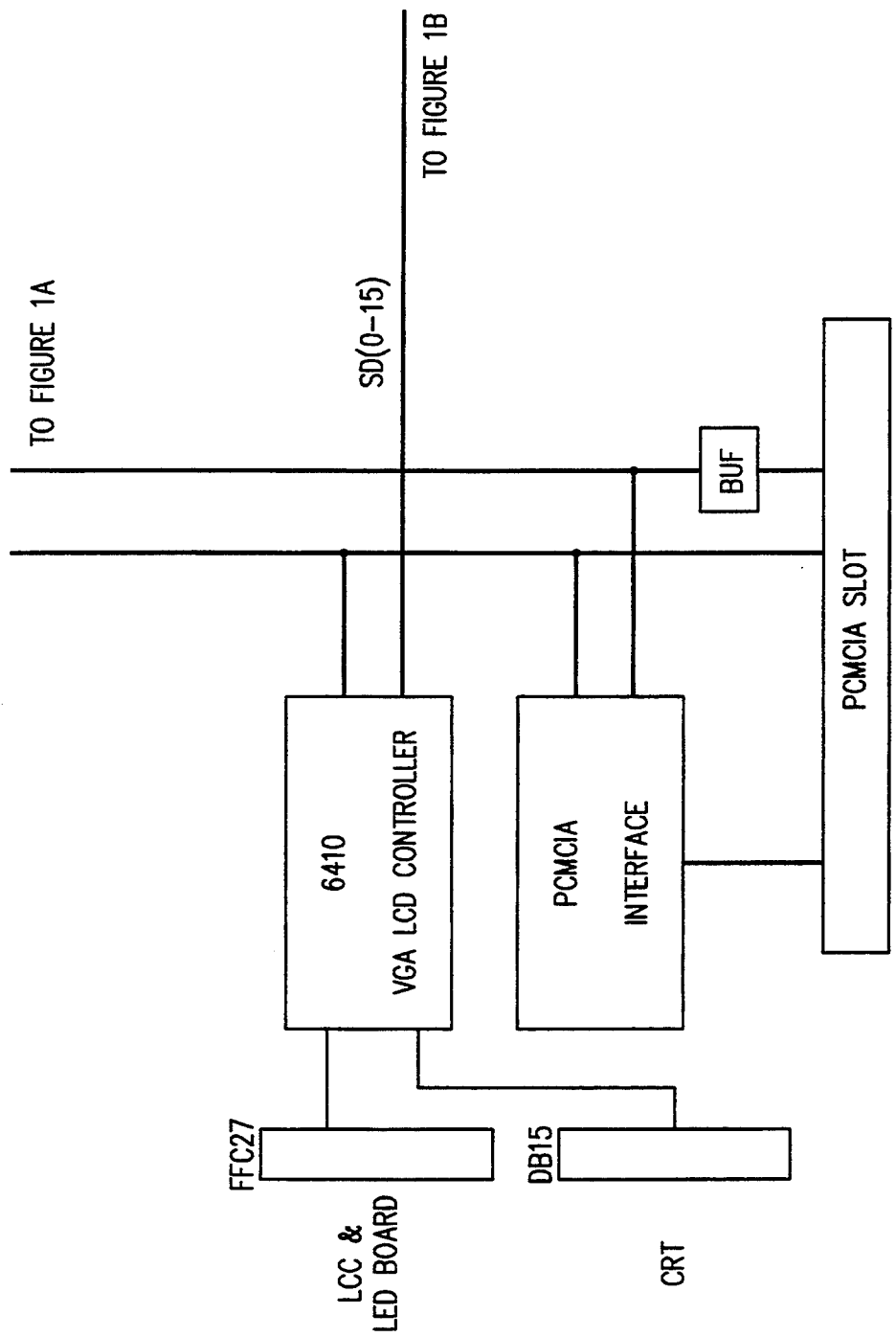
Figure 1D:
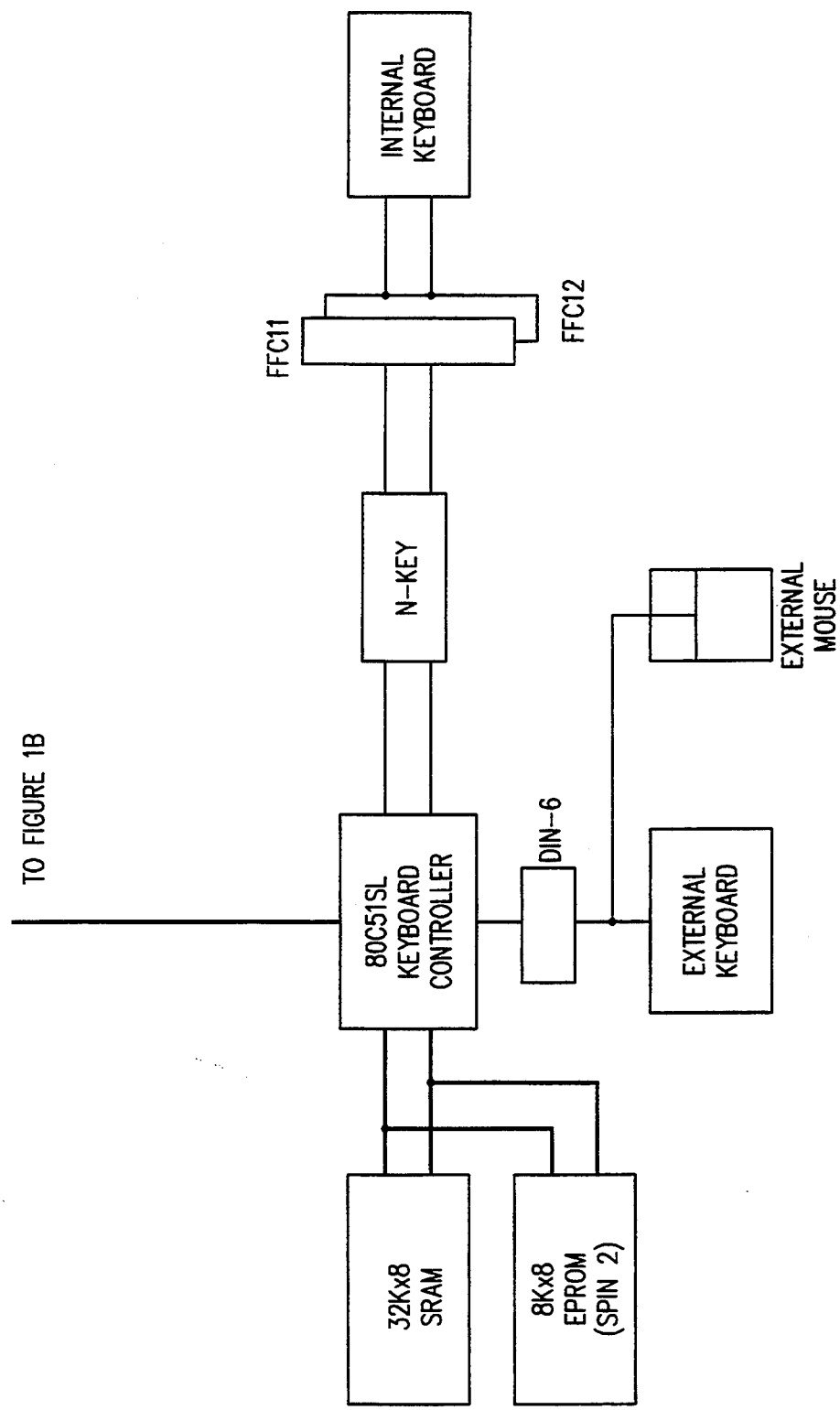
Figure 1E:
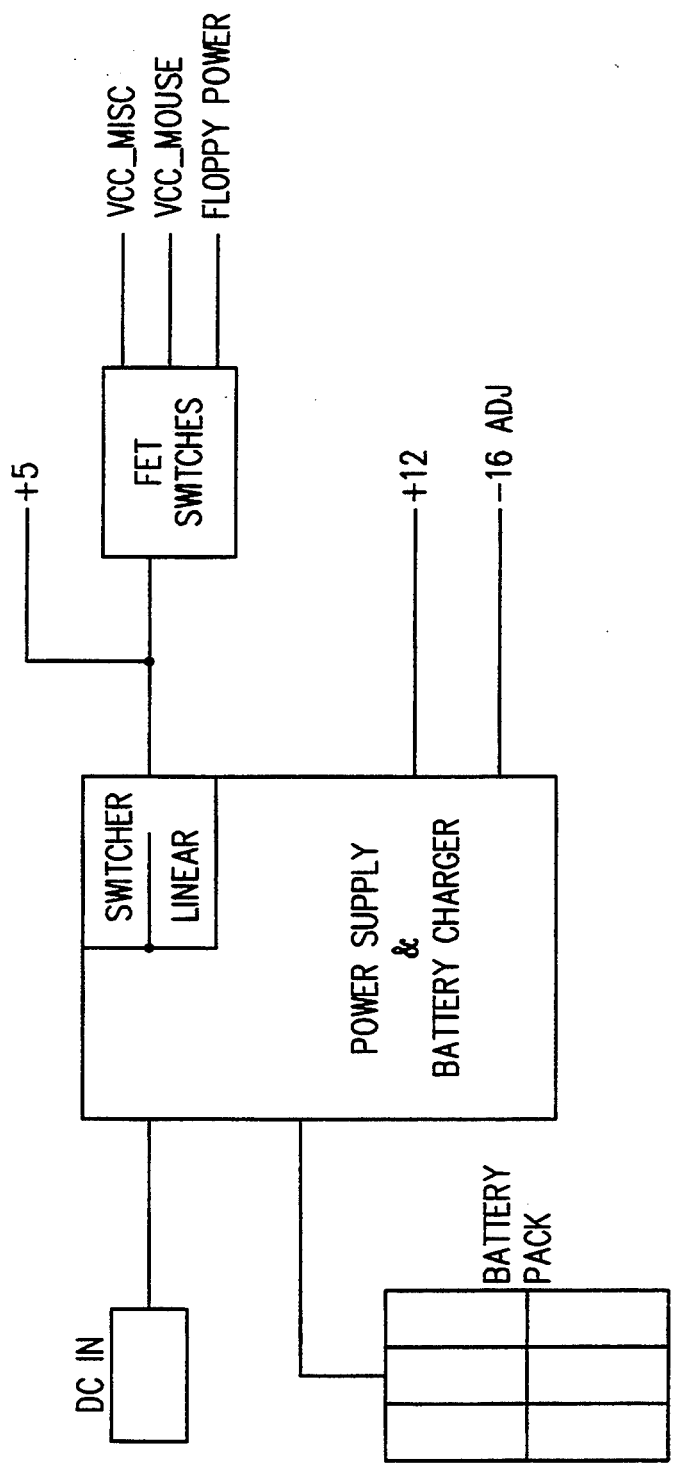

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Hardware Implementation Details

Following is a sample specific implementation of hardware portions of the disclosed innovations. This example is intended to better illustrate the disclosed generally applicable innovations, and to comply with the best-mode requirements of US patent law; but of course this specific implementation is subject to change (and will certainly be changed as time goes by), and can be altered, as will be apparent to those skilled in the art, in many details.

FIGS. 1A, 1B, 1C, 1D and 1E are parts of a single block diagram of the electrical organization of the small computer system of the presently preferred embodiment.

The system of the presently preferred embodiment weighs 3.6 pounds with battery, and is based on an Intel 386SL microprocessor running at 20 MHz. The system chassis, in the presently preferred embodiment, is 7.75-inches deep by 11 inches wide and 1.25-inches high.

The system includes 2-megabytes (MB) of system memory, expandable to 10 MB; a 3.5-inch, 1.44 MB portable diskette drive; and a 60 MB internal hard disk drive. Larger capacity hard drive configurations of 80 MB or 120 MB are available.

The preferred system embodiment incorporates an LCD display which is not edgelit (and hence has lower power requirements), yet offers an equivalent 12:1 contrast ratio, up to 640×480 resolution, and supports up to 64 gray scales. Reduced LCD power consumption allows the use of smaller, lighter batteries that together with efficient power management provide continuous screen display without LCD blank-outs. Directly mounting the LCD into the system housing also contributes to reduced overall system size and weight.

Integrated keyboard mouse support is also provided. This keyboard mouse emulation uses the Fn key and the cursor keys to emulate a mouse, as described in commonly-owned patent application Ser. No. 813,379, filed Dec. 23, 1991, entitled "Computer with Pointing Device Mapped into Keyboard" (DC-239), which is hereby incorporated by reference. This makes it convenient to use graphical user interface software, such as Windows, without having to carry an external mouse device.

A portable diskette drive (the "pocket floppy") is provided with each system and can be easily connected through the unit's parallel/diskette drive port. The device is highly portable, measuring 4.2 ×5.8×0.7 inches thick, and weighs 12 ounces.

A 10-ounce NiMH battery provides approximately three hours operating time on a single charge (without the use of power management modes). This battery measures 1.6×4.7×2.3 inches.

Figure 2A:
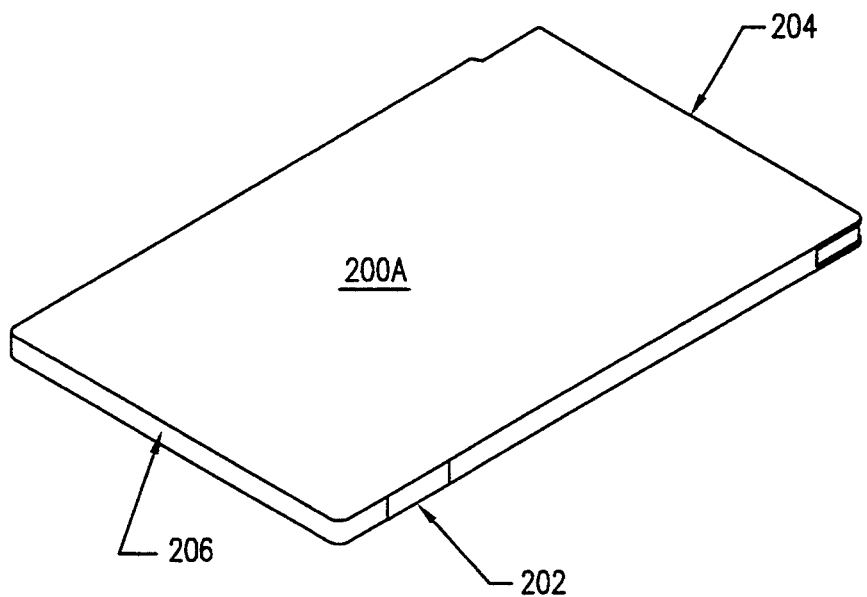
FIGS. 2A and 2B show an "IC card" according to the PCMCIA standard.
Figure 2B:
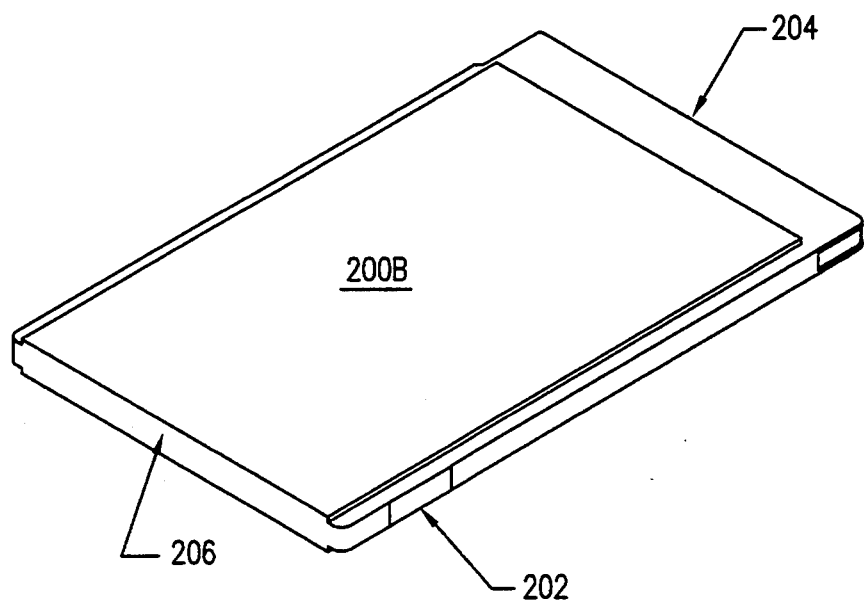

FIGS. 2A and 2B show two types of "IC card" 200, according to the PCMCIA standard. In accordance with the PCMCIA standard, ejection is accomplished by pressure on the defined flat spaces at the back of the card (next to connector 204). An I/O connector location 206 permits connection for external inputs.

However, according to the present invention, the ejection mechanism is accommodated without any disruption of the envelope of the computer. Instead, a slider is emplaced in a shallow recess in the surface of the computer. This slider is connected to a metal fork which bears on the defined spaces at the rear of the card. This provides a simpler and cheaper mechanism, avoids disruption of the external form factor of the computer, and is also less vulnerable to breakage than the competing approaches.

This approach also saves additional volume on the interior of the computer. The pushbutton ejection mechanism uses a bellcrank to translate the pushbutton's inward motion into outward motion of the ejector fork. With the system of the present invention, no such motion-translation mechanism is needed, which saves space and increases reliability.

The inventive approach does require that the PCMCIA slot be located close to a dihedral edge of the computer. However, this is believed not to be a difficult constraint.

One advantage of the presently preferred embodiment is that the ejector 400 forms one wall of the recess into which the card is inserted. This provides an advantage in weight, volume, and/or cost.

Figure 3:
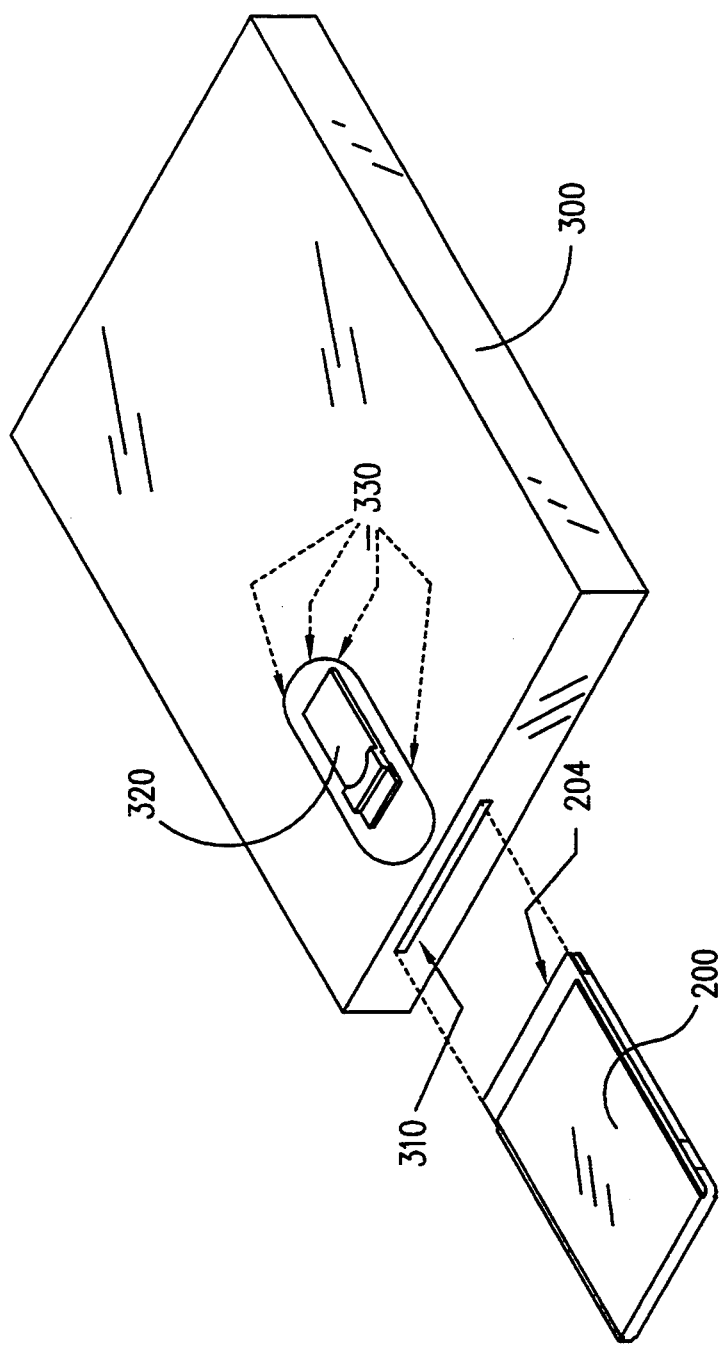
FIG. 3 is an overview showing generally how a small computer system according to the present invention can receive and eject IC cards.

FIG. 3 is an overview showing generally 2how a small computer system according to the present invention can receive and eject IC cards. In this Figure, the computer chassis 300 is shown upside down and closed. This view of the underside shows how the slider 320, which operates the ejector, is actually mounted on the bottom of the computer chassis 300.

Figure 4A:
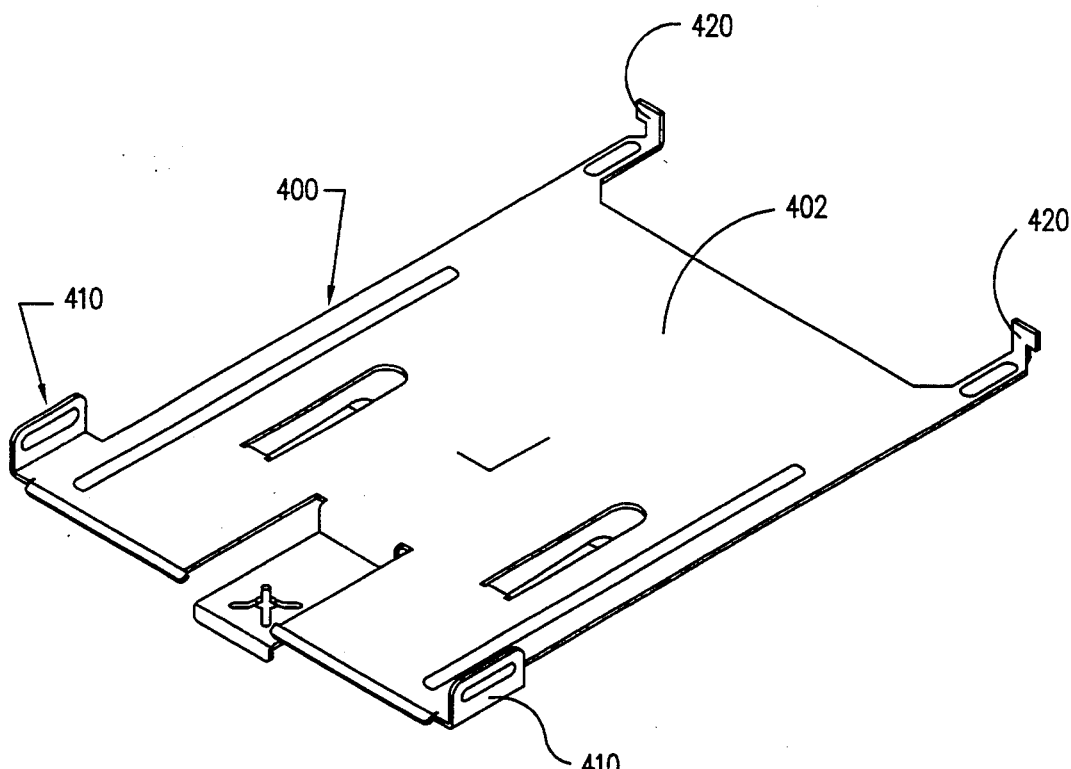
FIGS. 4A and 4B show the detailed structure of the ejector element of the presently preferred embodiment.
Figure 4B:
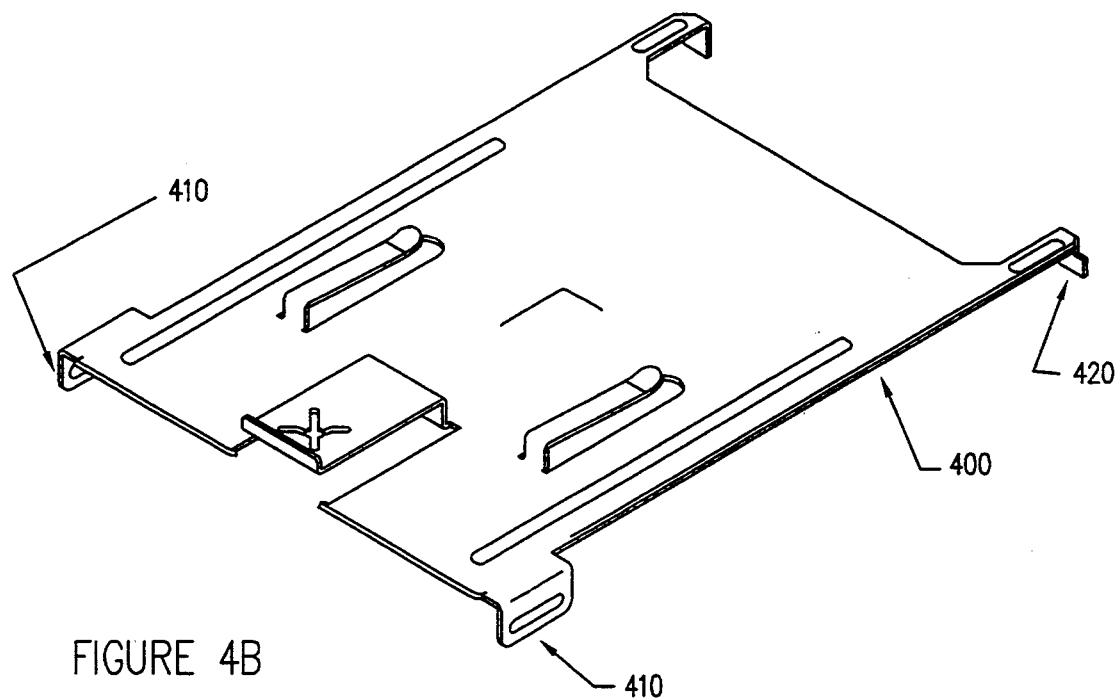

FIGS. 4A and 4B show the detailed structure of the ejector 400 of the presently preferred embodiment. This is preferably made from a thin piece of sheet metal, and (when ejecting a card) is predominantly in tension. Arms 420 push against the flat spaces adjacent to connector 204 in the card standard. Arms 420 are shown extending from a body portion 402 of ejector 400.

Note that the ejector 400, in the presently preferred embodiment, ALSO serves the functions of a grounding clip. Intel has proposed a grounding clip arrangement, which is likely to become a part of the PCMCIA standard as actually practiced. In this arrangement, two metallized areas 202, at the sides of the card 200 (as shown in FIGS. 2A and 2B), are contacted by grounding clips when the card is inserted into the card slot 310 in the computer 300. These metallized areas 202 connect to the body of the card, so that the whole conductive area of the card 200 provides a grounded conductive shield.

In the presently preferred embodiment, the ejector 400 also serves the function of this grounding clip. Note that the ejector, in the detail view of FIGS. 4A and 4B, has additional side extensions 410 which contact the metallized areas at the sides of an inserted card.

The ejector 400, in the presently preferred embodiment, is made of stainless steel sheet metal, about 0.010" thick.

Figure 5A:
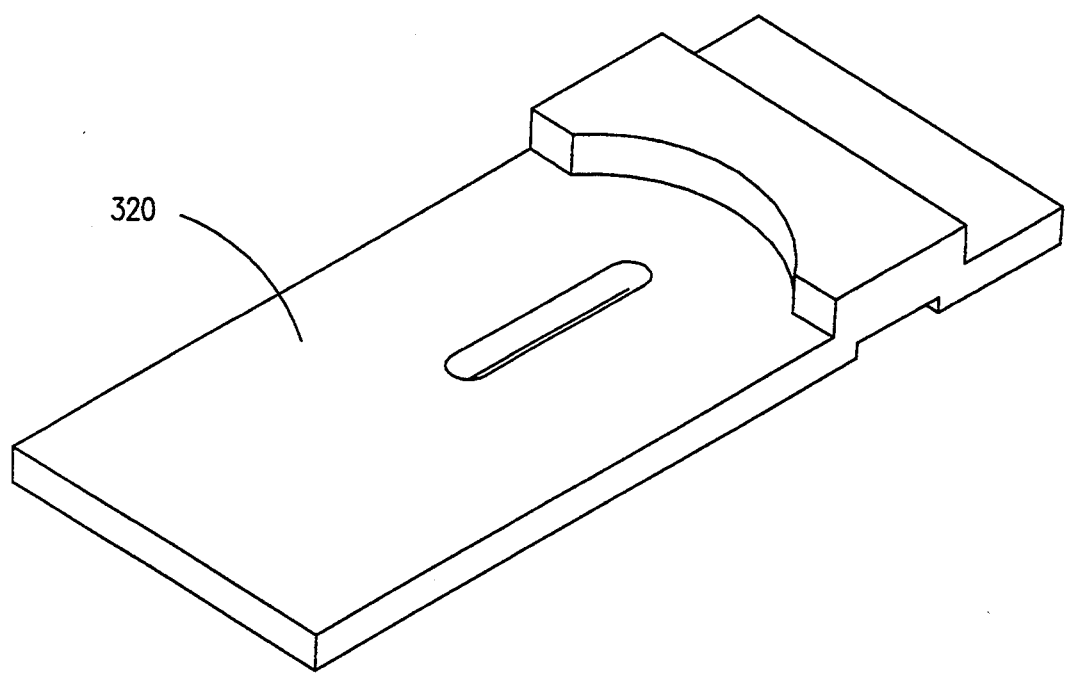
FIGS. 5A and 5B show the detailed structure of the external slider element of the presently preferred embodiment.
Figure 5B:
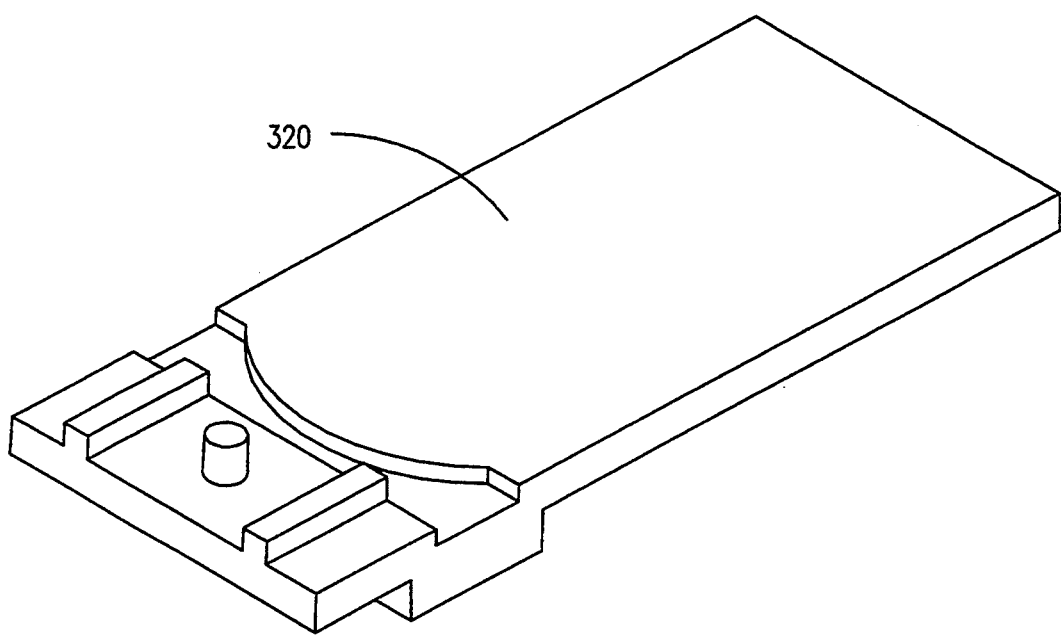

FIGS. 5A and 5B show the detailed structure of the external slider element 320 of the presently preferred embodiment.

Figure 6:
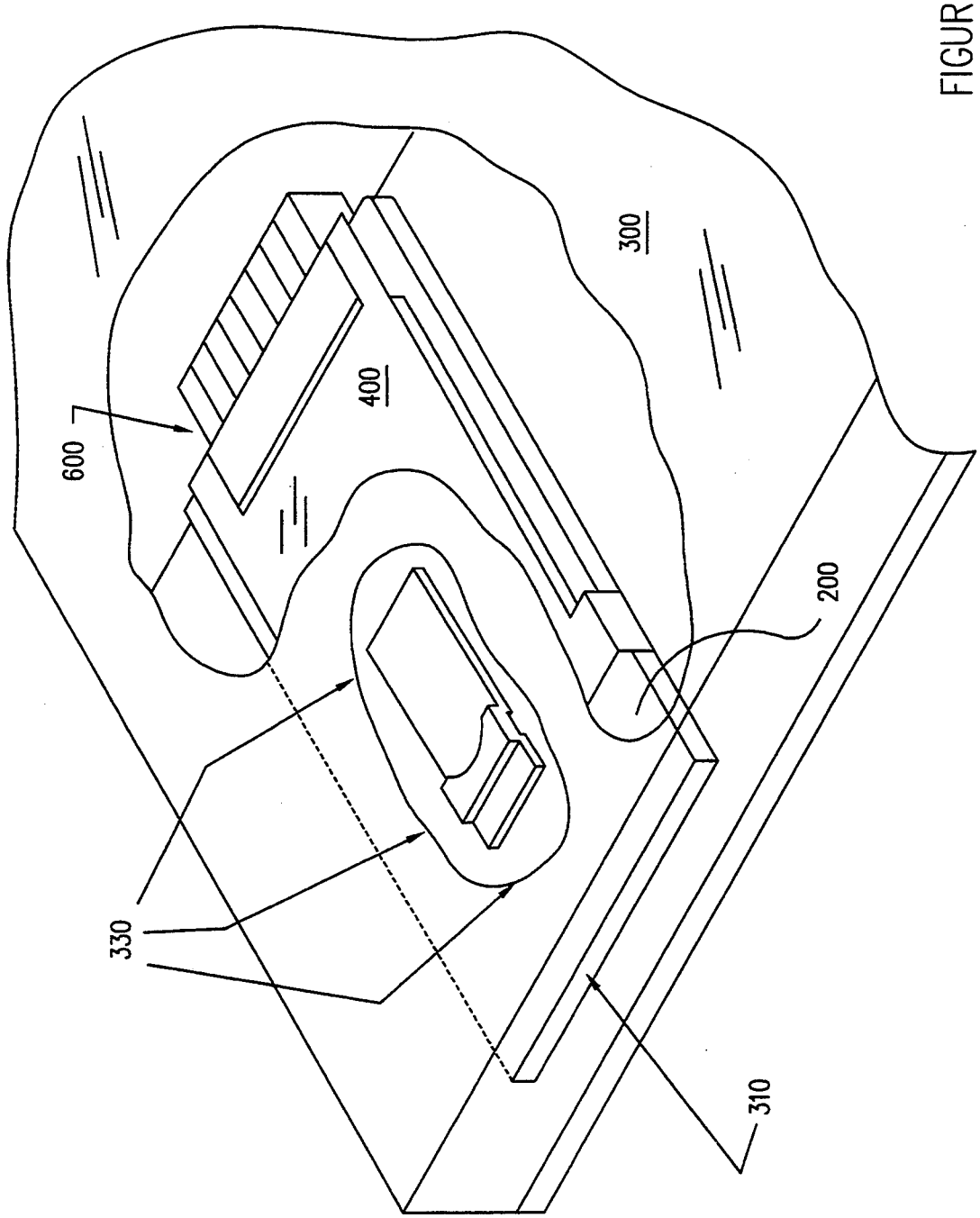
FIGS. 6, 7A, and 7B are detail cutaway views showing how the external slider and ejector elements are positioned, in the small computer system of the presently preferred embodiment, in a recess in an external surface of the case which is in proximity to the IC card slot and to the electrical connector (inside the case) for IC cards.
Figure 7A:
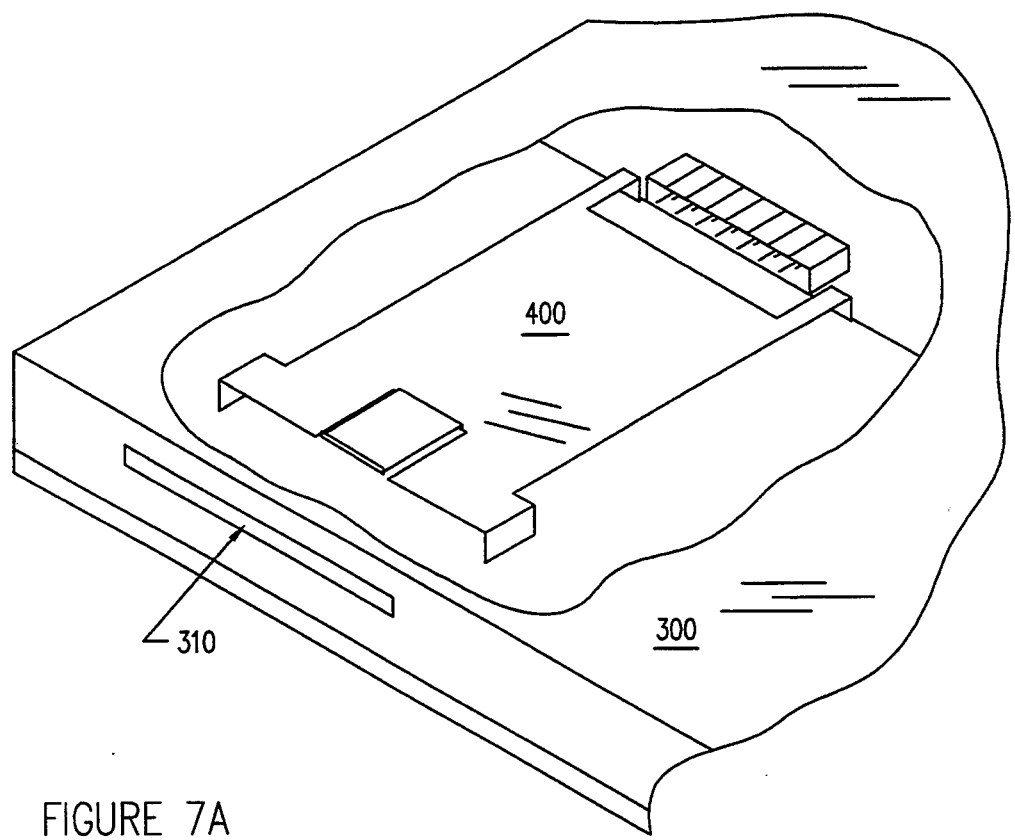
Figure 7B:
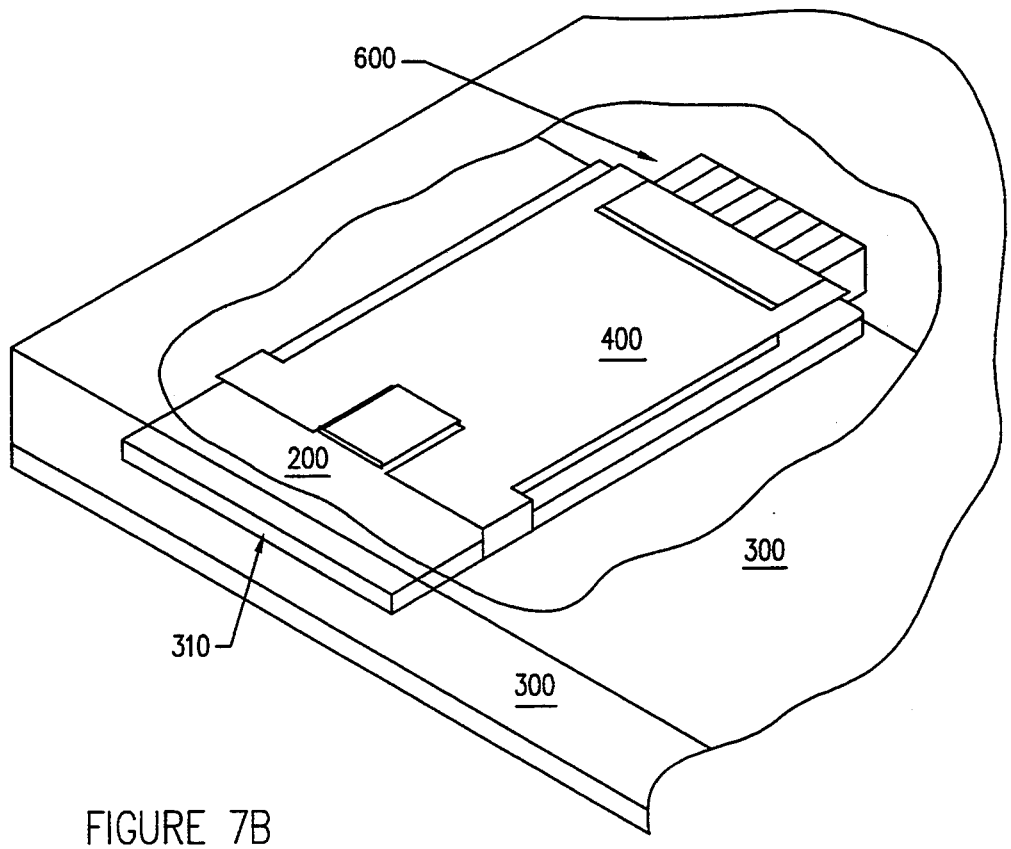

FIGS. 6, 7A, and 7B are detail cutaway views showing how the external slider 320 and ejector 400 are positioned, in the small computer system of the presently preferred embodiment, in a recess 330, in an external surface of the chassis 300, which is in proximity to the IC card slot 310 and to the IC card electrical connector 600 (inside the case).

Figure 8:
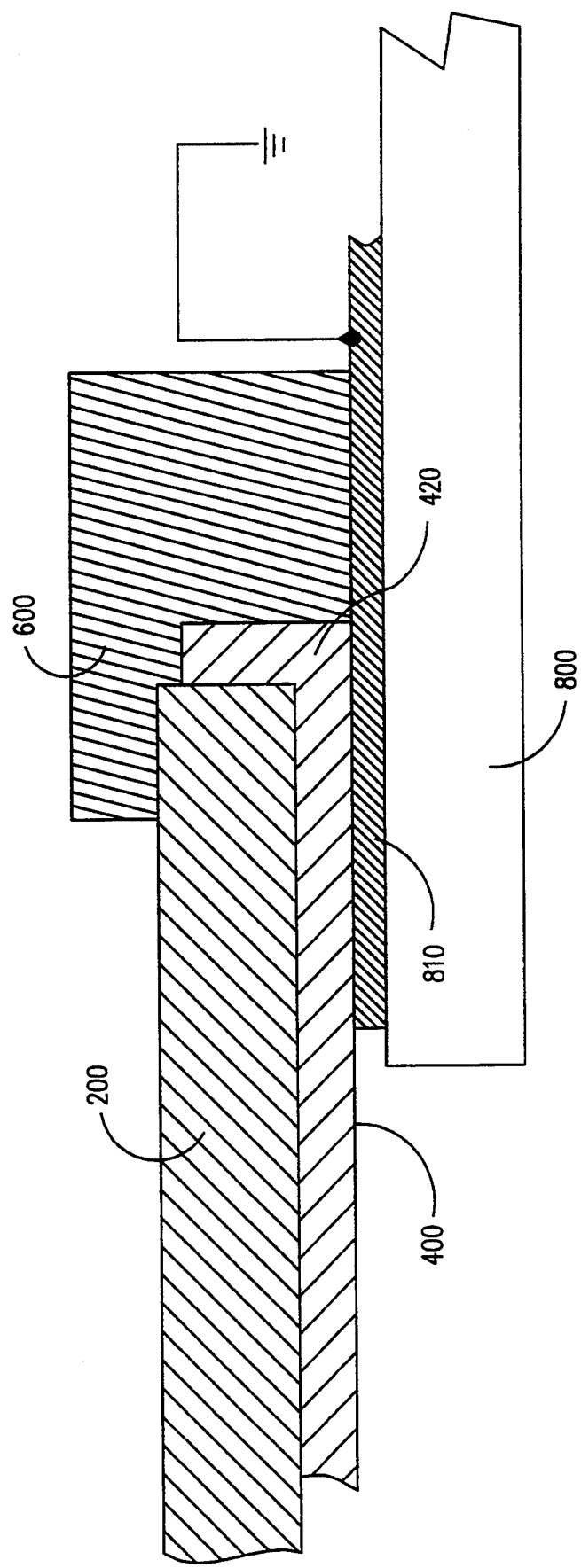
FIG. 8 shows how the ejector is grounded, in the presently preferred embodiment, by a wiping contact on the same circuit board which holds the card connector header.
Figure 9:
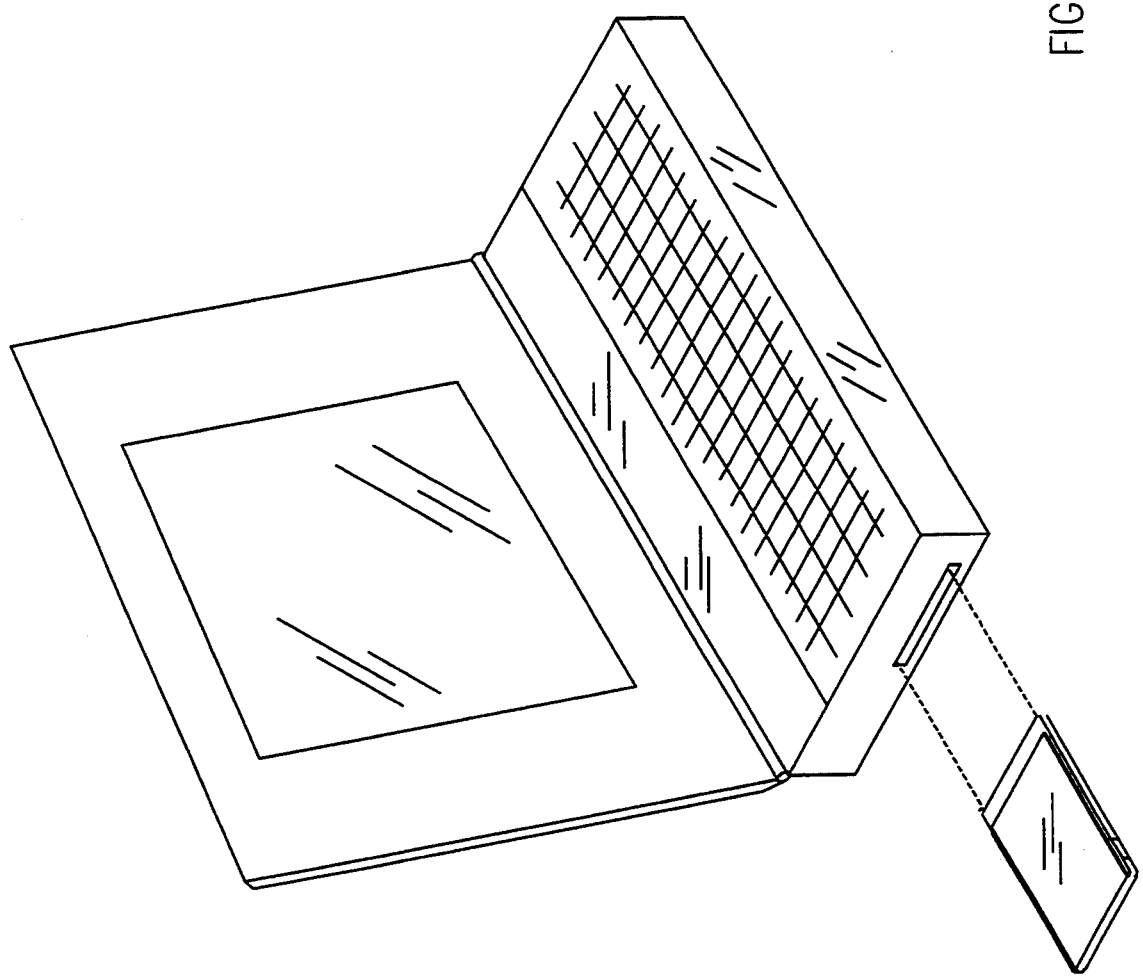
FIG. 9 gives an overview of the physical conformation of the small computer system of the presently preferred embodiment, with an IC card being inserted therein.

FIG. 8 shows how the ejector is grounded, in the presently preferred embodiment, by a wiping contact 810 on the same circuit board 800 which holds the card connector header 600.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

The PCMCIA card provides a wide variety of options in small computer architecture. For some purposes, a ribbon (or other) cable may extend out from the outer end of the card. This would open a variety of options for the system designer (such as providing a docking interface from portable to stationary computers); but such embodiments offer a further need for "user-proofing," in that the eject mechanism should be convenient enough that the user will not be tempted to pull on the cable to assist in ejection. Thus, the improved ejection mechanism of the present invention provides advantages in this alternative scenario.

It should also be noted that the disclosed innovations facilitate the manufacture of small computers with multiple card interface slots. It is particularly contemplated that this will facilitate the ergonomics and volumetric design of computers with two card interface slots. (The normal card interface controller chip actually provides enough I/O lines for connection to two card connectors if desired.)

In the presently preferred embodiment, no return spring is used for the ejector and slider. However, such a return spring can readily be added if desired.

In the presently preferred embodiment, the system chassis is made of nonconductive polymer. However, for improved EMI shielding, the chassis could easily be made of metal or conductive polymer instead. This would simplify the ground connection to the ejector and card.

Note that the ejector element, in the presently preferred embodiment, is predominantly in tension. This permits it to be compact and durable.

Of course, the specific contours of the ejector element of the presently preferred embodiment are not at all necessary for the practice of the invention. Widths can be varied, perforations can be added, and the amount of offset (above the plane of the card) to the slider connection can be varied.

It should also be noted that the disclosed innovative ideas are not limited solely to use in computers, but may also be adapted for use in other electronic systems, particularly portable lightweight systems (such as electronic cameras) which include microprocessor-controlled functionality.

It should also be noted that the disclosed innovative ideas are not limited only to ISA or EISA systems, but can also be implemented in systems using other bus architectures.

It should also be noted that the disclosed innovative ideas are not limited only to systems based on an $80 \times 86$-compatible microprocessor, but can also be implemented in systems using $680 \times 0$, RISC, or other processor architectures.

It should also be noted that the disclosed innovative ideas are not by any means limited to systems using a single-processor CPU, but can also be implemented in small computers using multiprocessor architectures.

It should also be noted that the disclosed innovative ideas are not by any means limited to systems in which the case is in a single piece, nor to systems in which all pieces of the case are connected, but is generally applicable to small computers (and analogous small electronic systems) even if the physical configuration uses two or more detached pieces.

Similarly, the disclosed innovative ideas can be used even in systems which do not include a full-sized keyboard, e.g. in stylus-operated computers. The disclosed innovative ideas can be advantageously used even if the system chassis is unusable until the proper IC card is inserted into it.

It should also be noted that the disclosed innovative ideas can be modified with other mechanical relations. For example, it is contemplated that one advantageous modification may be the use of additional moving elements to provide additional leverage to achieve initial motion of the contacts.

For dirt exclusion, the presently preferred embodiment merely uses a snap-in rubber grommet to close the card slot when not in use. However, alternatively, a spring-loaded trapdoor, or other arrangement, can be used instead.

The presently preferred embodiment uses a card slot dimension which will accept either Type 1 or Type 2 cards, but not Type 3 cards (if such become available). However, these dimensions can be readily varied if desired.

In the presently preferred embodiment, the keyboard and display are hinged together in a clamshell arrangement. However, it should be noted that the disclosed innovations can also be adapted to other physical arrangements (e.g. to use with a detachable wireless-or cable-connected keyboard and/or display).

In the presently preferred embodiment, the computer chassis in the closed position is a substantially rectangular solid, having six flat exterior sides. When the computer is in the open position, the portion which holds the display is so thin that it has essentially no usable volume, and no usable area on its sides. However, of course, the disclosed innovative teachings can be readily adapted to other conformations, e.g. using curved shapes for some of the chassis sides, or using a thicker portion for the display.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A computer system, comprising:
   a housing having, in at least one position thereof, a generally flattened shape, with first and second exterior surfaces which are substantially parallel to each other and a third exterior surface which is substantially perpendicular to said first and second exterior surfaces;
   at least one central processing unit (CPU) mounted within said housing;
   a card interface slot located on said third exterior surface and in proximity to, but not on, said first and second exterior surfaces of said housing, and dimensioned for accepting a card having a substantially rectangular broad surface and having connectors thereon in substantially predetermined locations;
   a card connector comprising a header configured to accommodate an electrical interface to said connectors of said card when said card is inserted in said card interface slot;
   at least one ejector including a body portion and a pair of arms extending from said body portion, wherein said pair of arms are positioned to bear on said card adjacent to the connectors of said card, and wherein said pair of arms are spaced on opposite sides of said card connector during times in which said card is positioned in said slot, and wherein said body portion of said ejector extends adjacently along said broad surface of said card during times in which said card is positioned in said slot, and wherein said ejector is enclosed between said first and second exterior surfaces of said housing such that said body portion of said ejector is slidably movable along an interior surface of a wall forming said second exterior surface of said housing;
   a recess formed in said second exterior surface of said housing; and
   a slider slidably positioned in said recess and mechanically connected to said ejector, wherein a user can push said slider to eject said card from said slot.

2. The computer system as recited in claim 1 wherein said ejector further comprises a pair of grounded side extensions dimensioned to electrically contact a respective pair of ground clips arranged upon the outer periphery of said card.

3. A computer system comprising:
   a housing having, in at least one position thereof, a generally flattened shape, with first and second exterior surfaces which are substantially parallel to each other and a third exterior surface which is substantially perpendicular to said first and second exterior surfaces;
   at least one central processing unit (CPU) mounted within said housing;
   a card interface slot located on said third exterior surface and in proximity to, but not on, said first and second exterior surfaces of said housing, and dimensioned for accepting a card having a substantially rectangular broad surface and having connectors thereon in substantially predetermined locations;
   a card connector comprising a header configured to accommodate an electrical interface to said connectors of said card when said card is inserted in said card interface slot;
   at least one ejector including a body portion and a pair of arms extending from said body portion, wherein said pair of arms are positioned to bear on said card adjacent to the connectors of said card, and wherein said pair of arms are spaced on opposite sides of said card connector during times in which said card is positioned in said slot, and wherein said body portion of said ejector extends adjacently along said broad surface of said card during times in which said card is positioned in said slot, and wherein said ejector is enclosed between said first and second exterior surfaces of said housing such that said body portion of said ejector is slidably movable along an interior surface of a wall forming said second exterior surface of said housing;
   a recess formed in said second exterior surface of said housing;
   a slider slidably positioned in said recess and mechanically connected to said ejector, wherein a user can push said slider to eject said card from said slot; and
   a circuit board on which said card connector is mounted, wherein a wiping contact is fabricated on said circuit board and is positioned such that a surface of said ejector contacts and is slidably movable along said wiping contact, wherein said ejector is conductive and is grounded by said wiping contact.

4. The computer system as recited in claim 3 wherein said ejector further comprises a pair of grounded side extensions dimensioned to electrically contact a respective pair of ground clips arranged upon the outer periphery of said card.

* * * * *